(12) United States Patent
Kanae

(10) Patent No.: US 9,711,708 B2
(45) Date of Patent: *Jul. 18, 2017

(54) ELECTRONIC COMPONENT HAVING A REINFORCED HOLLOWED STRUCTURE

(71) Applicant: Murata Manufacturing Co., Ltd., Kyoto (JP)

(72) Inventor: Masaaki Kanae, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 258 days.

This patent is subject to a terminal disclaimer.

(21) Appl. No.: 14/449,734

(22) Filed: Aug. 1, 2014

(65) Prior Publication Data

US 2014/0339956 A1    Nov. 20, 2014

Related U.S. Application Data

(63) Continuation of application No. PCT/JP2013/069084, filed on Jul. 12, 2013.

(30) Foreign Application Priority Data

Aug. 1, 2012  (JP) ................. 2012-171348

(51) Int. Cl.
*H01L 41/08*  (2006.01)
*H01L 41/053*  (2006.01)
*H03H 9/10*  (2006.01)

(52) U.S. Cl.
CPC ....... *H01L 41/0533* (2013.01); *H03H 9/1071* (2013.01); *H03H 9/1085* (2013.01);
(Continued)

(58) Field of Classification Search
CPC ..... H03H 9/105; H03H 9/1071; H03H 9/1042
(Continued)

(56) References Cited

U.S. PATENT DOCUMENTS 4,375,041 A * 2/1983 Aizawa ................ H03H 9/0509
310/312
4,699,682 A * 10/1987 Takishima ............. B29C 70/72
156/292

(Continued)

FOREIGN PATENT DOCUMENTS

CN  101107776 A  1/2008
JP  2002-252547 A  9/2002
(Continued)

OTHER PUBLICATIONS

International Search Report issued in Application No. PCT/JP2013/069084 dated Sep. 24, 2013.
(Continued)

*Primary Examiner* — J. San Martin
(74) *Attorney, Agent, or Firm* — Pearne & Gordon LLP

(57) ABSTRACT

Provide an electronic component that has a hollowed structure and is capable of suppressing the deformation of the hollowed structure due to the pressure during the module resin molding. The electronic component includes a device substrate 2, a driver portion 3 formed on one of the principle surfaces of the device substrate 2, a protection portion 4 configured to cover the driver portion 3 so as to form a hollowed space 8 around the driver portion 3, an adhesion layer 10 that is made of a resin and arranged above the protection portion 4, and a reinforcing plate 11 arranged on the adhesion layer 10, wherein the reinforcing plate 11 is a silicon substrate.

10 Claims, 9 Drawing Sheets

(52) U.S. Cl.
CPC ............... *H01L 2224/45139* (2013.01); *H01L 2224/48091* (2013.01)

(58) Field of Classification Search
USPC .............................................. 310/313, 344 R
See application file for complete search history.

(56) References Cited

U.S. PATENT DOCUMENTS

| | | | | |
|---|---|---|---|---|
| 5,095,240 | A * | 3/1992 | Nysen ................ | G06K 19/0672 310/313 R |
| 5,390,401 | A * | 2/1995 | Shikata ................... | H03H 3/08 29/25.35 |
| 5,821,665 | A * | 10/1998 | Onishi .................. | H03H 9/059 310/313 R |
| 6,543,109 | B1 * | 4/2003 | Taga .................. | H03H 9/02929 29/25.35 |
| 7,218,036 | B2 * | 5/2007 | Shimodaira .............. | H03B 5/36 310/340 |
| 7,259,500 | B2 * | 8/2007 | Iwamoto .............. | H03H 9/1092 310/340 |
| 8,018,120 | B2 * | 9/2011 | Moriya .............. | H03H 9/02574 310/313 A |
| 8,564,171 | B2 * | 10/2013 | Yamaji ................. | H03H 9/1092 310/313 A |
| 2007/0252481 | A1 | 11/2007 | Iwamoto et al. | |
| 2011/0012695 | A1 * | 1/2011 | Yamaji ............... | H03H 9/02937 333/193 |
| 2011/0084573 | A1 | 4/2011 | Yamaji et al. | |
| 2014/0015373 | A1 * | 1/2014 | Kanae ...................... | H03H 3/08 310/300 |
| 2014/0339956 | A1 * | 11/2014 | Kanae .................. | H03H 9/1071 310/311 |

FOREIGN PATENT DOCUMENTS

| | | |
|---|---|---|
| JP | 2007-042786 A | 2/2007 |
| JP | 2007-208665 A | 8/2007 |
| JP | 2007-318058 A | 12/2007 |
| JP | 2008-227748 A | 9/2008 |
| JP | 2009-159124 A | 7/2009 |
| JP | 2011-103645 A | 5/2011 |
| JP | 2012-109925 A | 6/2012 |
| WO | 2009/057699 A1 | 5/2009 |

OTHER PUBLICATIONS

Written Opinion issued in Application No. PCT/JP2013/069084 dated Sep. 24, 2013.

* cited by examiner (A)

(B)

ELECTRONIC COMPONENT HAVING A REINFORCED HOLLOWED STRUCTURE

BACKGROUND OF THE INVENTION

Field of the Invention

The present invention relates to electronic components with hollowed spaces and the like and electronic component modules incorporating such electronic components. The electronic components may be surface acoustic wave (SAW) devices, bulk acoustic wave (BAW) devices, and the like. Particularly, the present invention relates to electronic components including hollowed structures capable of withstanding the pressure of the resin sealing during the modularization, and electronic component modules incorporating such electronic components.

Description of the Related Art

As one example of conventional electronic components such as SAW devices, BAW devices, and the like, an electronic component described in Patent Document 1 is known. As illustrated in FIG. 9, this electronic component is provided with a driver portion 503 disposed on a piezoelectric substrate 520.

Further, a protection portion 524 forms a hollowed space 508. The hollowed space 508 is formed to secure a space required when an elastic wave or an acoustic wave propagates to the driver portion 503. Further, the protection portion 524 is composed of a first protection film 525, a second protection film 526, and a third protection film 527.

Note that although vibration protection films 509a and 509b are formed on the driver portion 503, the vibration protection films 509a and 509b protect the driver portion 503 and have frequency adjustment functions of the driver portion 503, but do not prevent the elastic wave or the acoustic wave from propagating at the driver portion 503.

Patent Document 1: Japanese Unexamined Patent Application Publication No. 2009-159124

BRIEF SUMMARY OF THE INVENTION

Recently, it becomes more common to use the foregoing electronic components with hollowed spaces in modularized forms by mounting these electronic components on modular substrates and performing the resin sealing so as to cover these electronic components. Thus, it is desirable to have electronic components capable of withstanding the pressure during the resin sealing at the modularization (for example, the transfer molding).

However, there is a possibility that an electronic component having the structure described in the foregoing Patent Document 1 may not withstand the pressure of the resin sealing during the modularization, thereby leading to the deformation of the protection portion which results in the deformation of the hollowed space therein.

The present invention has been made in view of the above described issue, and an object thereof is to provide an electronic component in which the deformation of the hollowed space is suppressed during the modularization.

An electronic component of the present invention includes a device substrate, a driver portion formed on one of the principal surfaces of the device substrate, a protection portion configured to cover the driver portion so as to form a hollowed space around the driver portion, an adhesion layer that is made of a resin and arranged above the protection portion, and a reinforcing plate arranged on the adhesion layer, wherein the reinforcing plate is a silicon substrate.

The present invention enables to suppress the deformation of the hollowed space during the module resin molding since the reinforcing plate that is a silicon substrate is disposed above the protection portion.

DETAILED DESCRIPTION OF THE INVENTION

Hereinafter, the embodiments of the present invention are described with reference to the drawings.

First Embodiment

Figure 1:
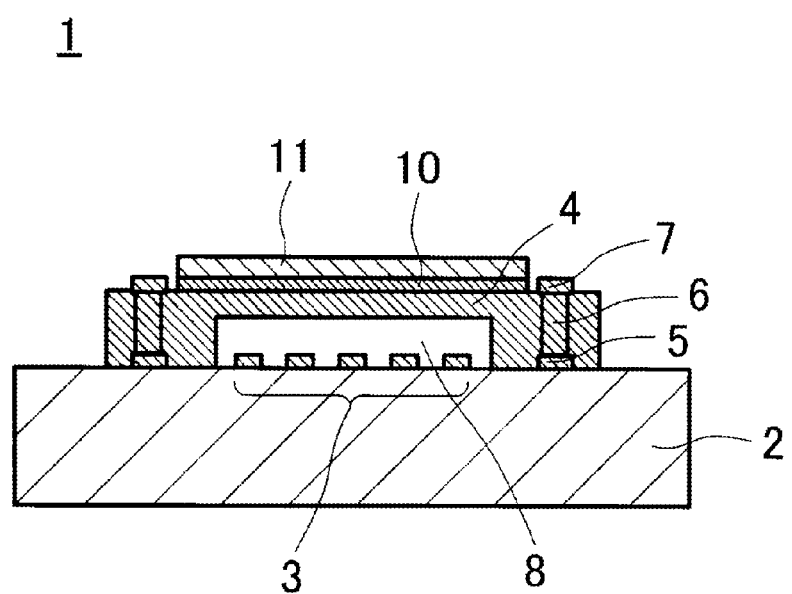
FIG. 1 is a cross sectional view of an electronic component according to a first embodiment of the present invention.

FIG. 1 is a cross sectional view of an electronic component according to the first embodiment of the present invention.

As illustrated in the cross sectional view of FIG. 1, the electronic component 1 includes a device substrate 2, a driver portion 3, a protection portion 4, pad electrodes 5, via conductors 6, mounting electrodes 7, an adhesion layer 10, and a reinforcing plate 11.

In the present embodiment, the electronic component 1 is an example of SAW device. In this case, the device substrate 2 is a piezoelectric substrate, and a surface wave propagates along the surface of the piezoelectric substrate. As a material of the piezoelectric substrate, $LiTaO_3$ or the like may be used, for example.

The driver portion 3 is formed on one of the principal surfaces of the device substrate 2. In the present embodiment, the driver portion 3 includes inter digital transducer (IDT) electrodes. As a material of the IDT electrode, Al or the like may be used, for example.

The protection portion 4 covers the driver portion 3 so as to form a hollowed space 8 around the driver portion 3. The protection portion 4 may have, for example, a three-layer structure and may be formed by the following method.

First, the whole area of one principal surface of the piezoelectric substrate is coated with a photosensitive polyimide resin. Subsequently, photolithography and development processing are performed to form a polyimide pattern with an opening so as to expose the driver portion 3 and its surrounding. After the pattern forming, the polyimide is heated for curing. Next, a multilayered film, in which a cover layer made of an epoxy film and a cover layer made of a polyimide film are stacked on top of each other, is arranged and thermocompression-bonded on the polyimide pattern in such a way that the cover layer made of an epoxy film faces the foregoing polyimide pattern.

The pad electrode 5 is formed on the surface of the device substrate 2, and the mounting electrode 7 is formed on the surface of the protection portion 4. Further, the via conductor 6 is formed so as to be buried inside the protection portion. The pad electrode 5 and the mounting electrode 7 are electrically connected through the via conductor 6. Still further, the driver portion 3 is electrically connected to the pad electrode 5. Thus, the driver portion 3 is electrically connected to the mounting electrode 7 through the pad electrode 5 and the via conductor 6. Note that it is preferable to form the IDT electrodes of the driver portion 3 and the pad electrodes 5 by the same process, since it costs less to fabricate. The IDT electrodes and the pad electrodes 5 may be formed by a formation method that uses a thin-film processing such as, for example, a sputtering method and the like.

The reinforcing plate 11 that is a silicon substrate is fixed on the protection portion 4 of the electronic component 1 with the adhesion layer 10 between them. In the first embodiment, a die attach resin film (DAF) is used for the adhesion layer 10.

The foregoing adhesion layer 10 and the reinforcing plate 11 may be formed on the protection portion 4 by the following method, for example.

First, a silicon wafer is prepared, and a die attach resin film that later becomes the adhesion layer 10 is pasted over the silicon wafer. Next, the silicon wafer on which the adhesion layer 10 is pasted is cut to a predetermined size and a predetermined thickness to obtain the reinforcing plate 11. For example, in the first embodiment, the reinforcing plate 11 has a thickness of 1 mm and a Young modulus of 140 GPa, and the adhesion layer 10 has a thickness of 0.5 mm and a Young modulus of 6 GPa.

Next, the reinforcing plate 11 on which the adhesion layer 10 is pasted is mounted on the protection portion 4 with a mounter in such a way that a side of the reinforcing plate 11 to which the adhesion layer 10 is pasted faces toward the protection portion 4. Subsequently, the reinforcing plate 11 is fixed on the protection portion 4 by solidifying the adhesion layer 10 by performing a solidification processing such as die bonding, heating, and the like. In the first embodiment, the temperature during the die bonding is 150 degrees C. Subsequently, the curing of the adhesion layer 10 is performed at a temperature of 155 degrees C. for a time period of one hour.

Note that silicone is used for the reinforcing plate 11 because silicone has advantages of being easy to process and allowing the reinforcing plate 11 to be made thin. Further, as illustrated in FIG. 1, in order to improve the deformation suppression effect of the hollowed space 8 at the time of the module resin molding, it is desirable to form the adhesion layer 10 and the reinforcing plate 11 over a wide area of the top surface of the protection portion 4 so that the adhesion layer 10 and the reinforcing plate 11 cover the protection portion 4 from an area at the other side of which the hollowed space 8 is formed to an area at the other side of which the hollowed space 8 is not formed.

Next, the foregoing electronic component 1 according to the first embodiment of the present invention and an electronic component having a conventional configuration are subjected to a pressure test to test the hollowed structure during the resin molding by the following method. This test confirms an improvement in the pressure resistance ability in the electronic component 1 according to the first embodiment of the present invention.

First, an electronic component of a conventional configuration that serves as a comparison example (not shown in the drawings) is prepared. The electronic component (the comparison example) differs from the electronic component 1 according to the first embodiment in that the electronic component (the comparison example) does not include the reinforcing plate that is a silicon substrate above the protection portion.

Next, the resin molding is performed on the electronic component 1 according to the first embodiment of the present invention and the electronic component (the comparison example) of a conventional configuration according to the comparison example.

As a result, in the electronic component (the comparison example) of a conventional configuration, a hollowed portion is deformed more as its position moves from an end portion to a center portion, resulting in the deformation of the hollowed space. On the other hand, in the electronic component 1 according to the first embodiment, the hollowed structure is kept intact without any deformation. In other words, in the present application, the reinforcing plate 11 that is a silicon substrate is configured to be arranged on the protection portion 4 via the adhesion layer 10. This enables to provide a structure strong enough to withstand the pressure at the time of the resin molding, and, as a result, suppress the deformation of the hollowed space 8.

Further, in addition to the foregoing matters, when electronic components having the features of the present application are employed, it is possible to mount the reinforcing plates by the use of a commercially available mounter. Thus, there is also an advantage that their fabrication may be easily performed without any special investment in the facilities.

Further, in the present application, the electronic component 1 capable of suppressing the deformation of the hollowed structure even at the modularization (the resin sealing) may be fabricated by applying the adhesion layer 10 to the reinforcing plate 11 in advance and mounting this reinforcing plate 11 on the protection portion 4 by the use of a mounter. Thus, no additional step is needed to reinforce the hollowed structure during the module molding.

Further, in a case where the electronic component 1 in which the protection portion 4 is made thicker in advance is prepared, there are issues that it is difficult to make the photosensitive polyimide resin thicker and costs more. However, the electronic component 1 with the features according to the present invention enables to fix the reinforcing plate 11 on the protection portion 4 inexpensively.

Note that, although the thickness and the Young modulus of the reinforcing plate 11 are specified in the above in the first embodiment, the thickness and the like may be arbitrarily determined depending upon the thickness and area of the protection portion 4, the size of the hollowed space 8, or the like.

Further, in the first embodiment, the die attach resin film is used as the adhesion layer 10. Alternatively, in place of the die attach resin film, the adhesion layer 10 may be formed by the screen-printing of a die attach resin.

Further, the adhesion of the reinforcing plate 11 on the protection portion 4 may alternatively be performed, in place of the above described method, by first pasting a die attach resin film that later becomes the adhesion layer 10 on the protection portion 4 and subsequently arranging and mounting the reinforcing plate 11 thereon.

Further, in the first embodiment, it is assumed that the reinforcing plate 11 is mounted on each electronic component 1 after individual pieces of the electronic components are prepared by dicing. Alternatively, in another method, a silicon wafer may be arranged over the protection portions 4 of plural electronic components 1 via the adhesion layer 10 before the dicing, not after the dicing. Subsequently, the plural electronic components 1 are diced to each individual electronic component.

Further, the foregoing reinforcing plate 11 may be a silicon substrate including a circuit board.

Second Embodiment

Next, an electronic component module 101 according to the second embodiment is described. The electronic component module 101 is an electronic component module on which the electronic component 1 according to the first embodiment is mounted.

Figure 2:
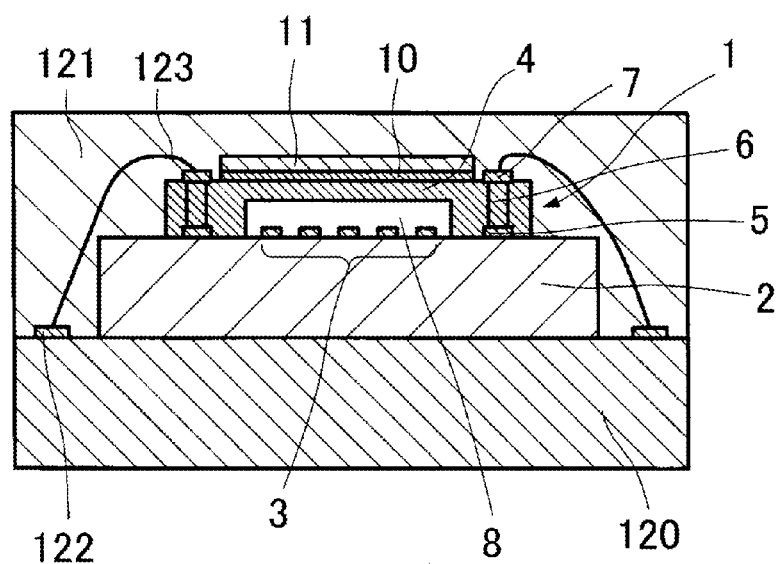
FIG. 2 is a cross sectional view of an electronic component module according to a second embodiment of the present invention.

FIG. 2 illustrates a cross sectional view of the electronic component module 101. As illustrated in FIG. 2, the electronic component module 101 includes a module substrate 120, an electronic component 1, and a resin layer 121. The electronic component module 101 may also include an IC device (not illustrated). The electronic component 1 is fixed on the module substrate 120. Further, the resin layer 121 is formed on one of the principal surfaces of the module substrate 120 so as to include the electronic component 1 therein.

The electronic component 1 or, more specifically, a mounting electrode 7 is electrically connected to a land electrode 122 disposed on the module substrate 120 via a wire 123. Accordingly, a driver portion 3 of the electronic component 1 is electrically connected to the land electrode 122 through a pad electrode 5, a via conductor 6, and the mounting electrode 7. Note that the land electrode 122 is provided to electrically connect the electronic component module 101 to an external circuit, and at least a portion of the land electrode 122 is exposed on a bottom surface of the electronic component module 101 (not illustrated).

Next, a fabrication method of the electronic component module 101 of the second embodiment according to the present invention is described with reference to cross sectional views of FIG. 3(A) to FIG. 3(C).

Figure 3:
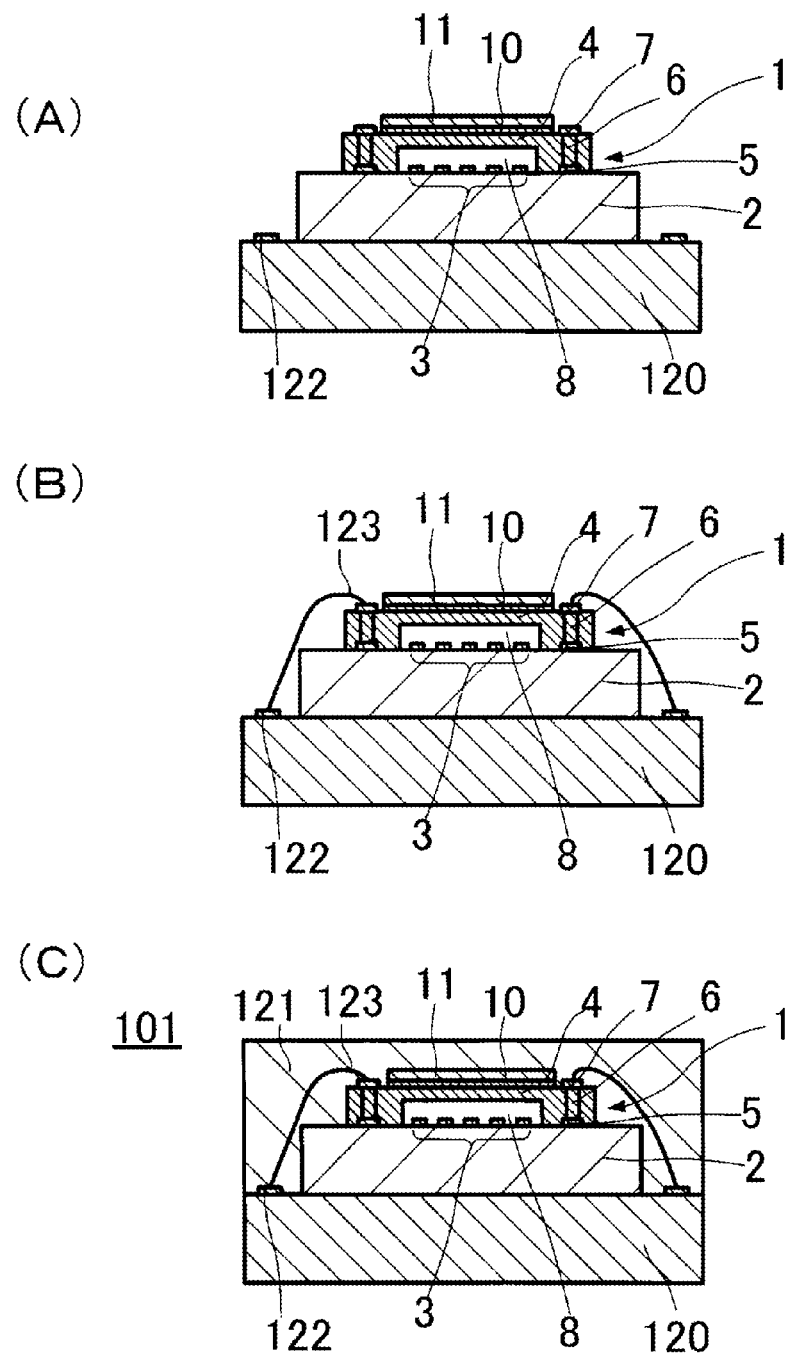
FIG. 3(A) to FIG. 3(C) are cross sectional views illustrating the fabrication steps of the electronic component module according to the second embodiment of the present invention.
Figure 4:
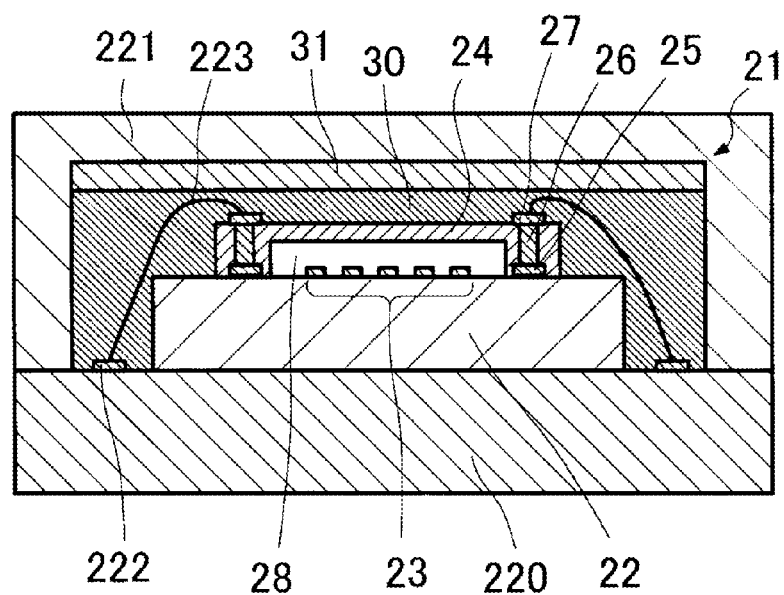
FIG. 4 is a cross sectional view of an electronic component module according to a third embodiment of the present invention.

First, as illustrated in FIG. 3(A), a module substrate 120 is prepared. An example of the module substrate 120 may be a printed board, a lead frame, or the like.

Next, by using a mounter, the electronic component 1 that is disposed at a predetermined location is held with a suction machine or the like and subsequently transported onto the module substrate 120 while being held with the mounter. There, the electronic component 1 is released from being held with the mounter, and fixed on one of the principal surfaces of the module substrate 120. Note that, when an adhesion layer (not illustrated) is formed between the module substrate 120 and the electronic component 1, the adhesion layer may be formed on the module substrate 120 in advance or an adhesion layer may be formed on a surface of the electronic component 1 opposite to the module substrate 120. When the adhesion layer is used, the electronic component 1 is fixed on the module substrate 120 by a curing processing such as heating or the like.

Next, as illustrated in FIG. 3(B), the mounting electrode 7 and the land electrode 122 disposed on the module substrate 120 are connected with the wire 123 by wire bonding. This allows the electronic component 1 and the electronic component module 101 to be electrically connected to each other.

Next, as illustrated in FIG. 3(C), the resin layer 121 is formed on the one of the principal surfaces of the module substrate 120 on which the electronic component 1 is fixed. In this case, the resin layer 121 is formed so as to include the electronic component 1 therein. A lamination method or a resin molding method may be used as a method for forming the resin layer 121. In this case, as described above, the electronic component 1 is configured to have the reinforcing plate 11 on the protection portion 4 via the adhesion layer 10 in advance. This provision of the reinforcing plate 11 enables to suppress the deformation of the hollowed space 8.

Note that in the second embodiment the electronic component 1 and the land electrode 122 are connected with the wire 123. Alternatively, in place of the wire bonding, another method such as a flip-chip bonding or another connecting method may be used for connecting.

The electronic component module 101 of the second embodiment on which the electronic component 1 of the first embodiment of the present invention is fabricated as described above. The electronic component module 101 enables to suppress the deformation of the hollowed space 8 in the electronic component 1 due to the pressure of the resin sealing at the time of the modularization since it utilizes the electronic component 1 including the reinforcing plate 11.

Third Embodiment

Next, as another embodiment, FIG. 4, FIGS. 5(A) and 5(B), and FIGS. 6(C) and 6(D) illustrate cross sectional views of an electronic component module 210 according to the third embodiment of the present invention. Here, FIGS. 5(A) and 5(B) and FIGS. 6(C) and 6(D) are cross sectional views illustrating the fabrication steps of the electronic component module 201.

As illustrated in FIG. 4, FIGS. 5(A) and 5(B), and FIGS. 6(C) and 6(D) and as is the case with the electronic component module 101 in the second embodiment, the electronic component module 210 according to the third embodiment includes a module substrate 220 and an electronic component 21 fixed on the module substrate 220. The electronic component 21 includes a device substrate 22, a driver portion 23, a protection portion 24, pad electrodes 25, via conductors 26, mounting electrodes 27, an adhesion layer 30, and a reinforcing plate 31. The electronic component module 210 further includes a resin layer 221 so as to include the electronic component 21 therein.

Further, as is the case with the electronic component module 101 according to the second embodiment, the electronic component 21 or, more specifically, the mounting electrode 27 of the electronic component 21 is electrically connected to a land electrode 222 disposed on the electronic component module 201 via a wire 223. Accordingly, the driver portion 23 of the electronic component 21 is electrically connected to the land electrode 222 through the pad electrode 25, the via conductor 26, and the mounting electrode 27.

However, the electronic component module 101 according to the second embodiment is configured so that the wire 123 is arranged outside the adhesion layer 10 whereas the electronic component module 201 according to the third embodiment is configured so that the wire 223 is arranged inside the adhesion layer 30. Accordingly, the third embodiment enables not only to suppress the deformation of a hollowed space 28 during the modularization (the resin sealing) but also improve the pressure resistance of the wire 223 itself at the time of the resin sealing.

Below, a method for fabricating the electronic component module 201 according to the third embodiment is described. Note that only outlines are provided for the portions similar to those of the first or second embodiment, and the detailed descriptions thereof are abbreviated.

Figure 5:
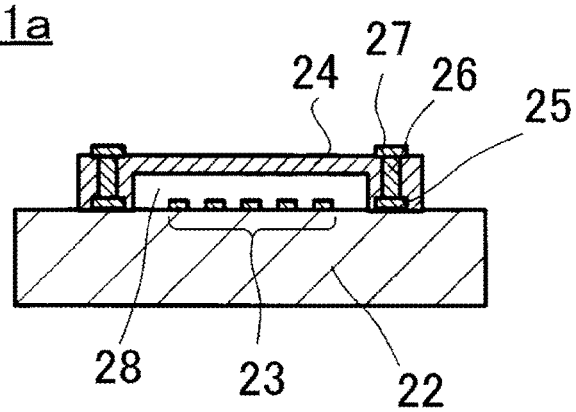
FIG. 5(A) and FIG. 5(B) are cross sectional views illustrating the fabrication steps of the electronic component module according to the third embodiment of the present invention.
Figure 5:
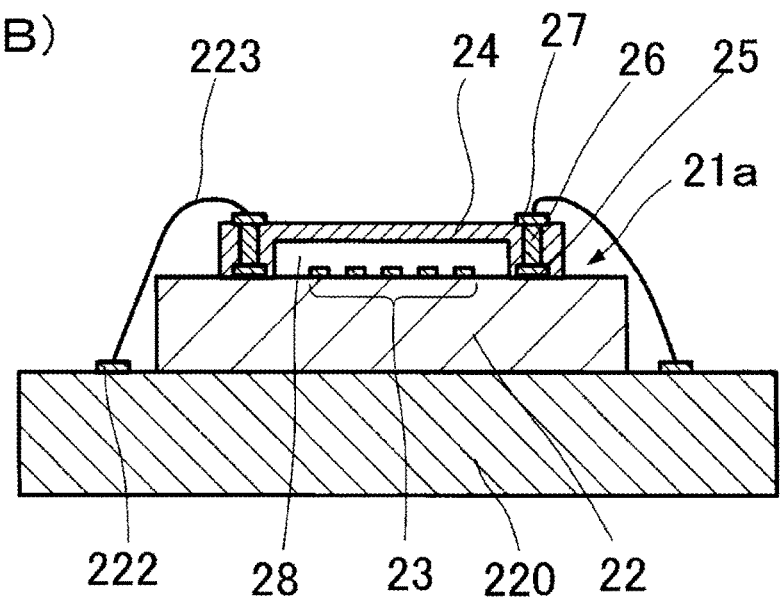

First, as illustrated in FIG. 5(A), an electronic component main body 21a is prepared by a method similar to that of the first embodiment. The electronic component main body 21a forms a portion of the electronic component 21. Note that, as illustrated in FIG. 5(A), at this stage, the adhesion layer 30 and the reinforcing plate 31 are not yet formed on the protection portion 24.

Next, as illustrated in FIG. 5(B), the module substrate 220 is prepared, and the electronic component main body 21a is fixed on one of the principal surfaces of the module substrate 220 by use of a mounter or the like. Further, the mounting electrode 27 and the land electrode 222 disposed on the module substrate 220 are connected with the wire 223 by wire bonding.

Figure 6:
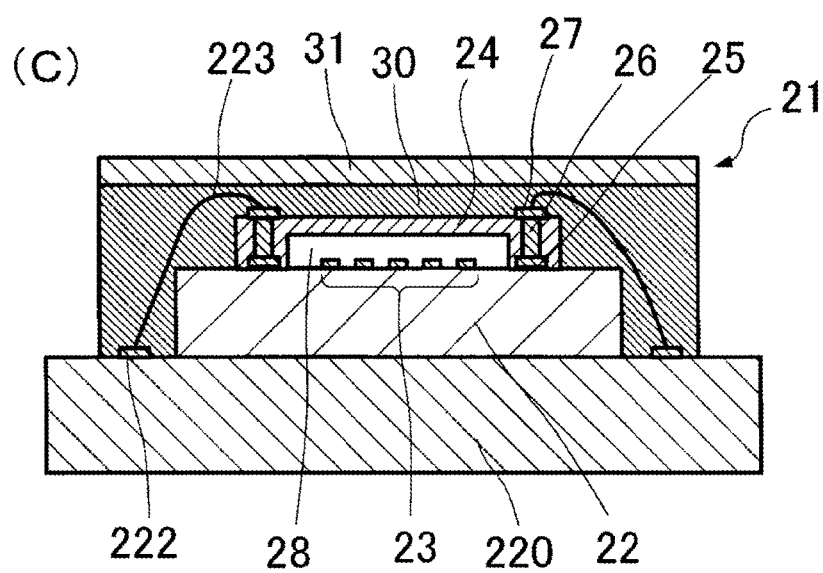
FIG. 6(C) and FIG. 6(D) are cross sectional views illustrating the fabrication steps of the electronic component module according to the third embodiment of the present invention.
Figure 6:
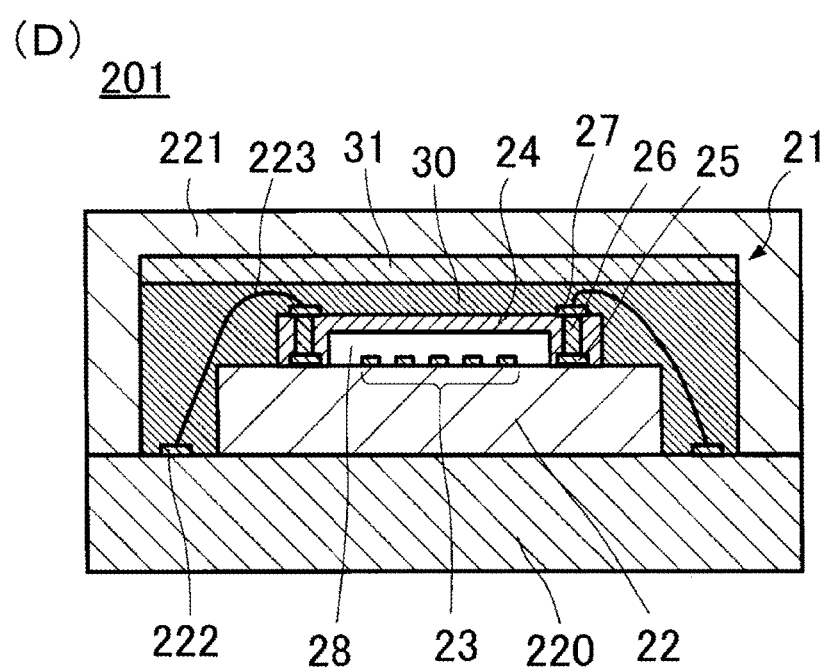

Next, as illustrated in FIG. 6(C), the reinforcing plate 31 is fixed at a location that allows the reinforcing plate 31 to cover an area that includes at least a space above the protection portion 24 with the adhesion layer 30 between them. This finishes the formation of the electronic component 21 on the module substrate 220. Here, the adhesion layer 30 is arranged so that the adhesion layer 30 covers at least a top surface of the protection portion 24 and takes a shape so as to include the wire 223 therein. Note that in the third embodiment a die-attach resin film is used as the adhesion layer 30.

Next, as illustrated in FIG. 6(D), the resin layer 221 is formed on the one of the principal surfaces of the module substrate 220, on which the electronic component 1 is fixed, by a lamination method or a resin molding method so that the resin layer 221 takes a shape to include the electronic component 21 therein. In the present embodiment, as described in the above description, the electronic component 21 is configured to have the reinforcing plate 31 above the protection portion 24 with the adhesion layer 30 between them in advance. This provision of the reinforcing plate 11 enables to suppress the deformation of the hollowed space 28. Further, the electronic component 21 is configured so that the wire 223 is buried inside the adhesion layer 30. This enables to improve the pressure resistance of the wire 223 itself during the resin sealing.

The above described method enables the formation of the electronic component 201 of the third embodiment, in which the pressure resistance at the time of the resin sealing is improved in both the wire 223 and the hollowed structure all at once.

Note that the die-attach resin is used for the adhesion layer 30 since the die-attach resin has stronger adhesion force and is easy to apply over the reinforcing plate 31 that is a silicon substrate. Further, the die-attach resin has a Young modulus of about 4 to 8 GPa.

Figure 7:
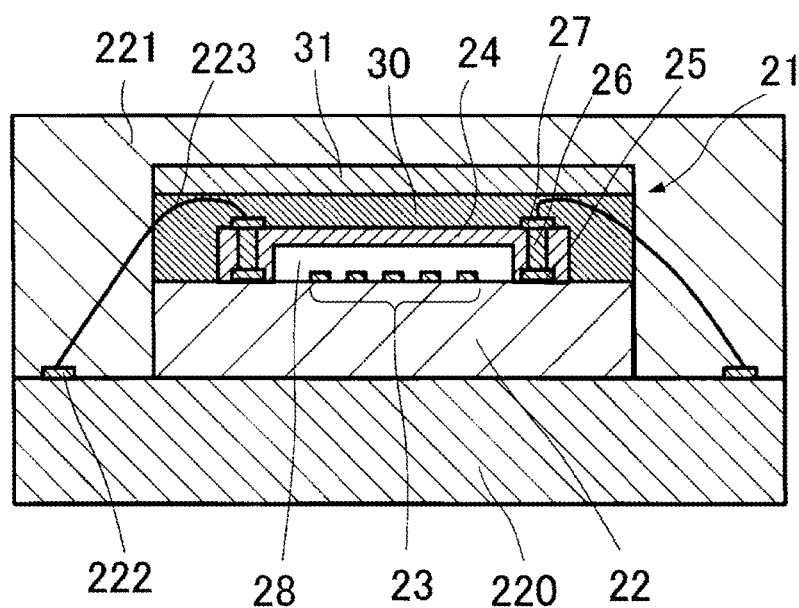
FIG. 7 illustrates a modification example (a cross sectional view) of the electronic component module according to the third embodiment of the present invention.
Figure 8:
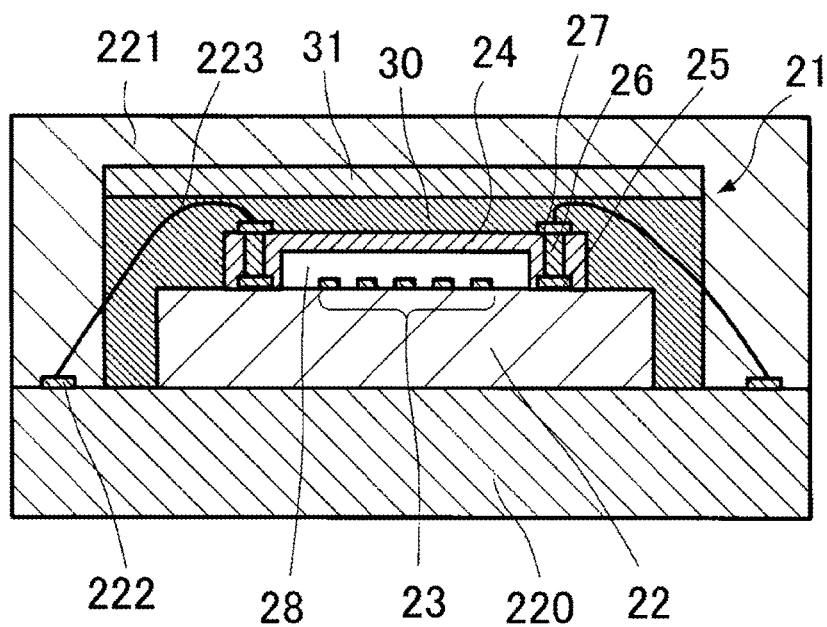
FIG. 8 illustrates a modification example (a cross sectional view) of the electronic component module according to the third embodiment of the present invention.
Figure 9:
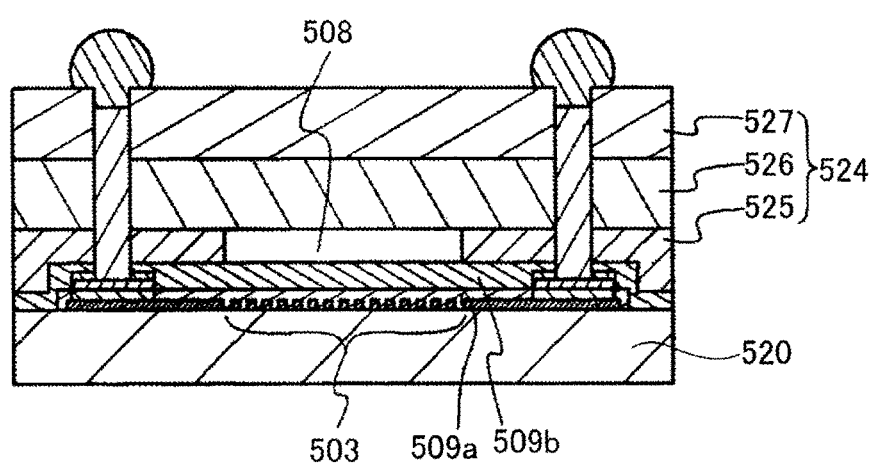
FIG. 9 is a cross sectional view of an electronic component module according to Patent Document 1.

Further, the third embodiment is configured so that the whole of the wire 223 is buried inside the adhesion layer 30. However, the whole of the wire 223 is not necessarily buried, and in another embodiment the wire 223 may be buried partially in the adhesion layer 30 as illustrated in FIG. 7 and FIG. 8. This configuration also enables to improve the pressure resistances of the hollowed structure as well as the wire 223 itself at the time of the resin sealing.

Further, the foregoing embodiments are described using a SAW device as an example of the electronic component. However, the present invention is not limited to the SAW device, but may also be applicable to cases where the electronic components are BAW devices or micro electro mechanical systems (MEMS) devices.

Further, the present invention is not limited to the foregoing embodiments, and various modifications and changes may be made within the scope of the present invention.

1, 21 Electronic component
2, 22 Device substrate
3, 23 Driver portion
4, 24 Protection portion
5, 25 Pad electrode
6, 26 Via conductor
7, 27 Mounting electrode
8, 28 Hollowed space
10, 30 Adhesion layer
11, 31 Reinforcing plate
21a Electronic component main body
101, 201 Electronic component module
120, 220 Module substrate
121, 221 Resin layer
122, 222 Land electrode
123, 223 Wire
503 Driver portion
508 Hollowed space
509a, 509b Vibration protection film
520 Piezoelectric substrate
524 Protection portion
525 First protection film
526 Second protection film
527 Third protection film

The invention claimed is:

1. An electronic component comprising:
a device substrate,
a driver portion formed on one of principal surfaces of the device substrate,
a protection portion configured to cover the driver portion so as to form a hollowed space around the driver portion,
an adhesion layer made of a resin and arranged above the protection portion, and
a reinforcing plate arranged on the adhesion layer.

2. The electronic component according to claim 1, wherein
the reinforcing plate is a silicon substrate.

3. The electronic component according to claim 1, wherein
the adhesion layer is a die-attach resin.

4. The electronic component according to claim 2, wherein
the adhesion layer is a die-attach resin.

5. An electronic component module, comprising
the electronic component according to claim 1 mounted on a module substrate, and
a resin layer formed by molding so as to cover the electronic component.

6. An electronic component module, comprising
the electronic component according to claim 2 mounted on a module substrate, and
a resin layer formed by molding so as to cover the electronic component.

7. An electronic component module, comprising
the electronic component according to claim 3 mounted on a module substrate, and
a resin layer formed by molding so as to cover the electronic component.

8. The electronic component module according to claim 5, wherein
the electronic component and the module substrate are connected with a wire by wire bonding, and
a portion or a whole of the wire is buried in the adhesion layer.

9. The electronic component module according to claim 6, wherein
the electronic component and the module substrate are connected with a wire by wire bonding, and
a portion or a whole of the wire is buried in the adhesion layer.

10. An electronic component module, comprising
the electronic component according to claim 4 mounted on a module substrate, and
a resin layer formed by molding so as to cover the electronic component.

\* \* \* \* \*